United States Patent [19]

Snyder

[11] Patent Number: 4,510,484

[45] Date of Patent: * Apr. 9, 1985

[54] PIEZOELECTRIC REED POWER SUPPLY FOR USE IN ABNORMAL TIRE CONDITION WARNING SYSTEMS

[75] Inventor: Daniel S. Snyder, Norwalk, Ohio

[73] Assignee: Imperial Clevite Inc., Glenview, Ill.

[*] Notice: The portion of the term of this patent subsequent to May 24, 2000 has been disclaimed.

[21] Appl. No.: 479,504

[22] Filed: Mar. 28, 1983

[51] Int. Cl.³ .............................................. B60C 23/02
[52] U.S. Cl. ...................................... 340/58; 73/146.5
[58] Field of Search ..................................... 340/52 R, 58;
200/61.22, 61.23, 61.24, 61.25; 116/34 A, 34 B,
34 R; 73/146, 146.2, 146.3, 146.4, 146.8, 146.5;
310/311, 339, 319; 455/127, 343, 345

[56] References Cited

U.S. PATENT DOCUMENTS

| | | |
|---|---|---|
| 3,456,134 | 7/1969 | Ko . |
| 3,553,588 | 9/1967 | Honig .............................. 310/339 X |
| 4,075,603 | 2/1978 | Snyder et al. . |
| 4,117,452 | 9/1978 | Snyder et al. . |
| 4,160,234 | 7/1979 | Karbo et al. . |
| 4,237,728 | 12/1980 | Betts et al. . |
| 4,384,482 | 5/1983 | Snyder ............................ 340/58 X |

FOREIGN PATENT DOCUMENTS 2026284 1/1980 United Kingdom .
2064883 6/1981 United Kingdom .

Primary Examiner—John W. Caldwell, Sr.
Assistant Examiner—Ellwood G. Harding
Attorney, Agent, or Firm—Russell E. Baumann

[57] ABSTRACT

A device is provided for sensing the condition of a pneumatic tire preferably of the type used on an automobile wherein the tire is mounted on a tire rim and the tire is subject to normal vibrations. The device comprises a housing, a band for mounting the housing to the tire rim, a sensor for monitoring the condition within the tire, circuitry operatively connected to the sensor for generating radio signals indicative of the tire condition, power supply operatively connected to the circuitry and a receiver for receiving the radio signals. The power supply includes a piezoelectric reed having a base portion and an end portion. The base portion is elastomerically bonded to the housing. A tuning mass member is mounted to the end portion and is configured for mating abutment against stop members which limit the flexure stroke of the piezoelectric reed and inhibit compound bending of the reed. The tuning mass member includes an outer weighted casing and an inner elastomeric portion insulating the reed from physical shocks to the outer casing and from electrical shorts across the casing. The tuning mass member is sized relative to the piezoelectric reed to obtain a resonant frequency of vibration of the power supply induced by common road vibrations during wheel operation. The reed is symmetrically configured about a radiating center line of the tire.

9 Claims, 6 Drawing Figures

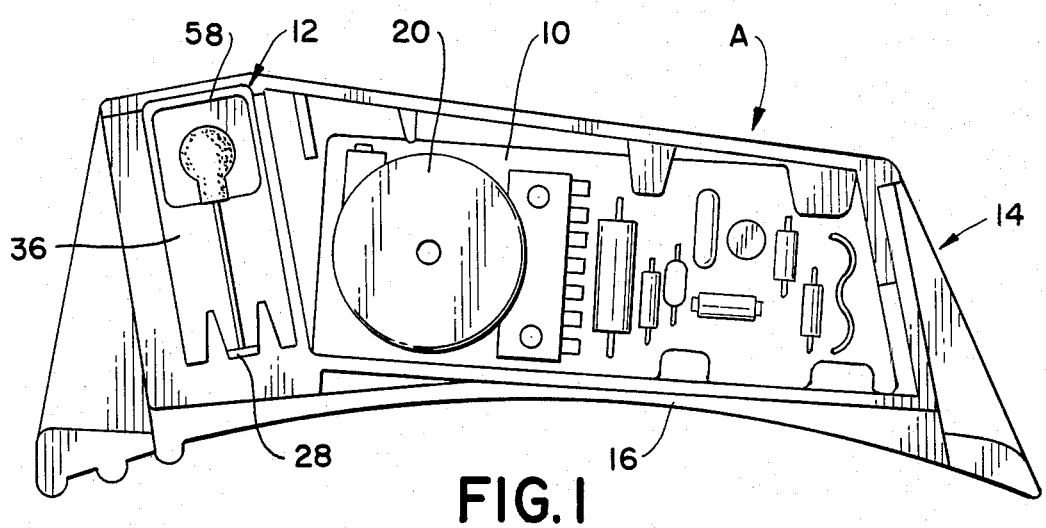
FIG. 1
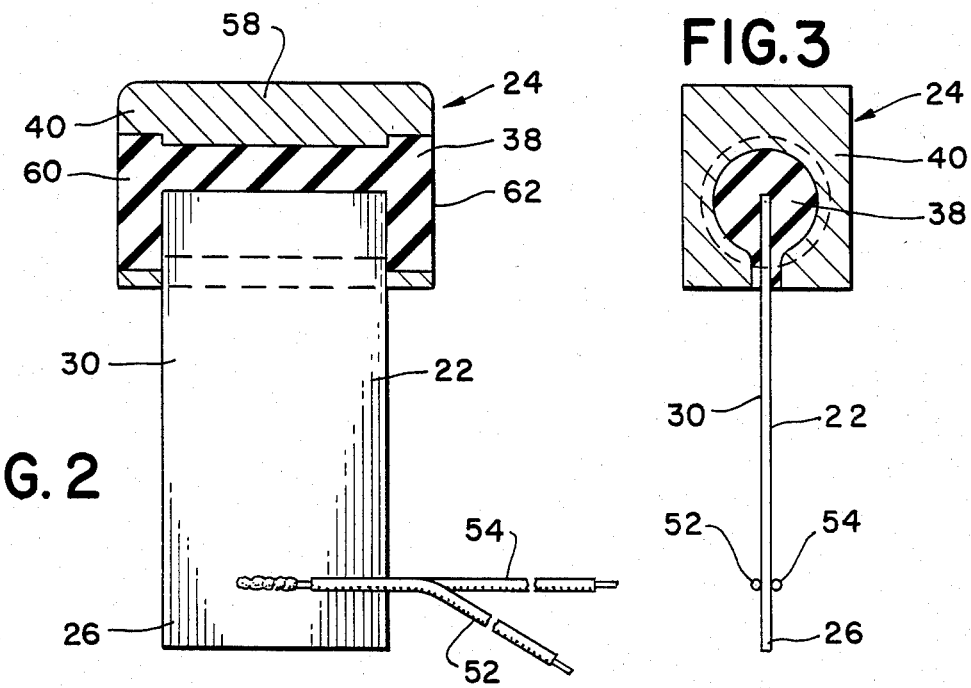
FIG. 2
FIG. 3
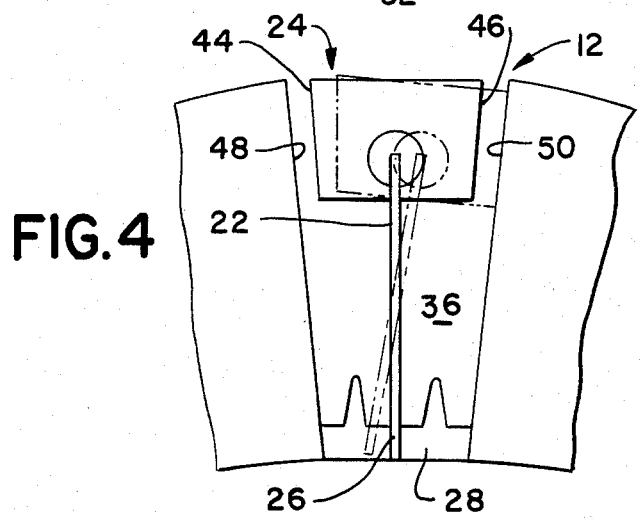
FIG. 4

PIEZOELECTRIC REED POWER SUPPLY FOR USE IN ABNORMAL TIRE CONDITION WARNING SYSTEMS

BACKGROUND OF THE INVENTION

This invention pertains to the art of radio devices and particularly to autonomous power supplies for use therewith.

The invention is particularly applicable to a piezoelectric reed transducer power supply for use in an abnormal tire condition warning system including an electrically powered radio frequency transmitter. Such a power supply may be advantageously employed in conjunction with a low tire warning system as is disclosed in U.S. Pat. No. 4,237,728 as incorporated herein by reference. However, it will be appreciated by those skilled in the art that the invention can be readily adapted for use in other environments as, for example, where similar autonomous or self-contained power supplies are employed to provide electrical energy.

The subject tire condition warning system includes a radio transmitter circuit to be mounted in a pneumatic tire preferably of the type used on an automobile wherein the tire is mounted on a tire rim and the tire is subject to normal operating vibrations. Such a location is extremely hazardous to the system and will subject it to extreme shock, vibration, temperature and pressure. In addition, the location is relatively inaccessible for regular maintenance and repair. Power supplies for such systems have therefore been required to be able to withstand the harsh environment and yet provide a reliable source of electrical energy over the life span of the tire.

Prior vibrating piezoelectric transducer power supplies have heretofore been suggested and employed. However, such prior power supplies have met with varying degrees of success.

It has been found that acceleration forces in excess of 25 g's may induce damaging types of flexure movement to the transducer. In particular, such damaging flexure movement includes unsafe bending amplitudes which stress the piezoelectric materials of the transducer thereby causing cracking, chipping or breakage of the transducer itself and compound bending flexure movements which similarly produce high and damaging stress levels to the piezoelectric crystal materials. In addition, significant shock inputs to the crystal material from impingement of the transducer against the transducer housing can cause damage.

Another problem inherent in prior vibrating transducer power supplies for use in tire condition warning systems has comprised transducers which were only sensitive to irregular tire vibrations and which would accordingly produce a varying electrical energy output dependent upon tire operation. Such a problem would preclude use of the power supply with a wide variety of wheel sizes and centrifugal loads.

Yet another problem existing in vibrating transducer power supplies included on a rotating item such as a wheel is that when the transducer is off-line from a radiating center line of the rotating item, centrifugal forces will urge the transducer into alignment with the center line. Such urging may inhibit vibrating of the transducer as where alignment of the transducer along the center line will cause it to maintain an abutment with an adjacent wall or support member.

The present invention contemplates a new and improved device which overcomes certain of the above referred to problems and others to provide a new piezoelectric transducer power supply compatible for use in a tire condition warning system which is simple in design, economical to manufacture, readily adaptable to a plurality of uses with a wide variety of tire wheel sizes, radio circuits and centrifugal loads, easy to install and which provides improved operation for the generation of electrical energy.

BRIEF SUMMARY OF THE INVENTION

In accordance with the present invention, there is provided an electrical power supply comprising a piezoelectric responsive transducer mounted to a base adapted to sense mechanical vibration. The transducer has a one end portion fixed against flexure movement and a second end portion disposed for flexure movement. A tuning mass member is mounted to the second end portion for facilitating flexure movement of the transducer in associative response to the mechanical vibration. The mass member has opposed first and second side walls. Opposed first and second stop members are configured for mating abutment with the first and second side walls of the mass member respectively. The power supply operates to produce electrical energy when the transducer is flexed.

In accordance with another aspect of the present invention, the first and second side walls of the tuning mass member and the opposed first and second stop members are configured to inhibit compound bending of the transducer upon abutment of the first and second side walls to the first and second stop members. The tuning mass members taper toward the fixed one end portion of the transducer and the stop members comprise inclined mating wall portions.

In accordance with a further aspect of the present invention the tuning mass member comprises an inner elastomeric portion and an outer weighted casing. The elastomeric portion is bonded to the transducer.

In accordance with yet another aspect of the present invention, the tuning mass member is sized relative to the reed to provide a natural resonant frequency of the transducer of generally 60 Hertz.

In accordance with the present invention there is provided a device for sensing the condition of a pneumatic tire preferably of the type used on an automobile wherein the tire is mounted on a tire rim and the tire is subject to normal vibrations. The device comprises a housing, a means for mounting the housing to the tire rim, sensing means for monitoring the condition within the tire, circuit means operatively connected to the sensing means for generating radio signals indicative of the tire condition, power supply means operatively connected to the circuit means and means for receiving the radio signals. The power supply means includes a piezoelectric reed symmetrically configured about a radiating center line of the tire.

One benefit obtained by use of the present invention is a piezoelectric reed power supply for use in an abnormal tire condition warning system which will generate electrical energy under a wide variety of operating conditions and centrifugal loads to power a radio transmitter.

Another benefit obtained from the present invention is a piezoelectric reed power supply which is limited in the bending amplitude of a piezoelectric reed element to give substantially infinite life to the power supply.

A further benefit of the present invention is a piezoelectric reed power supply which includes a tuning mass member which is sized relative to the reed to generate a preselected power supply resonant frequency which is compatible with vibrations to the wheel system to produce optimum power operation.

Other benefits and advantages for the subject new power supply will become apparent to those skilled in the art upon a reading and understanding of this specification.

BRIEF DESCRIPTION OF THE DRAWINGS

The invention may take physical form in certain parts and arrangements of parts, the preferred embodiment of which will be described in detail in this specification and illustrated in the accompanying drawings which form a part hereof and wherein:

FIG. 1 is a cross-sectional view of a radio transmitter for use in an abnormal tire condition warning system including a piezoelectric read power supply formed in accordance with the present invention;

FIG. 2 is a cross-sectional view of a piezoelectric reed and a tuning mass member formed in accordance with the present invention;

FIG. 3 is an end view in partial section of a piezoelectric reed and tuning mass member formed in accordance with the present invention;

FIG. 4 is an enlarged view of a piezoelectric reed power supply received in a housing chamber particularly illustrating the flexure movement of the reed, including the mating engagement with the housing chamber side walls;

DETAILED DESCRIPTION OF THE INVENTION

Figure 5:
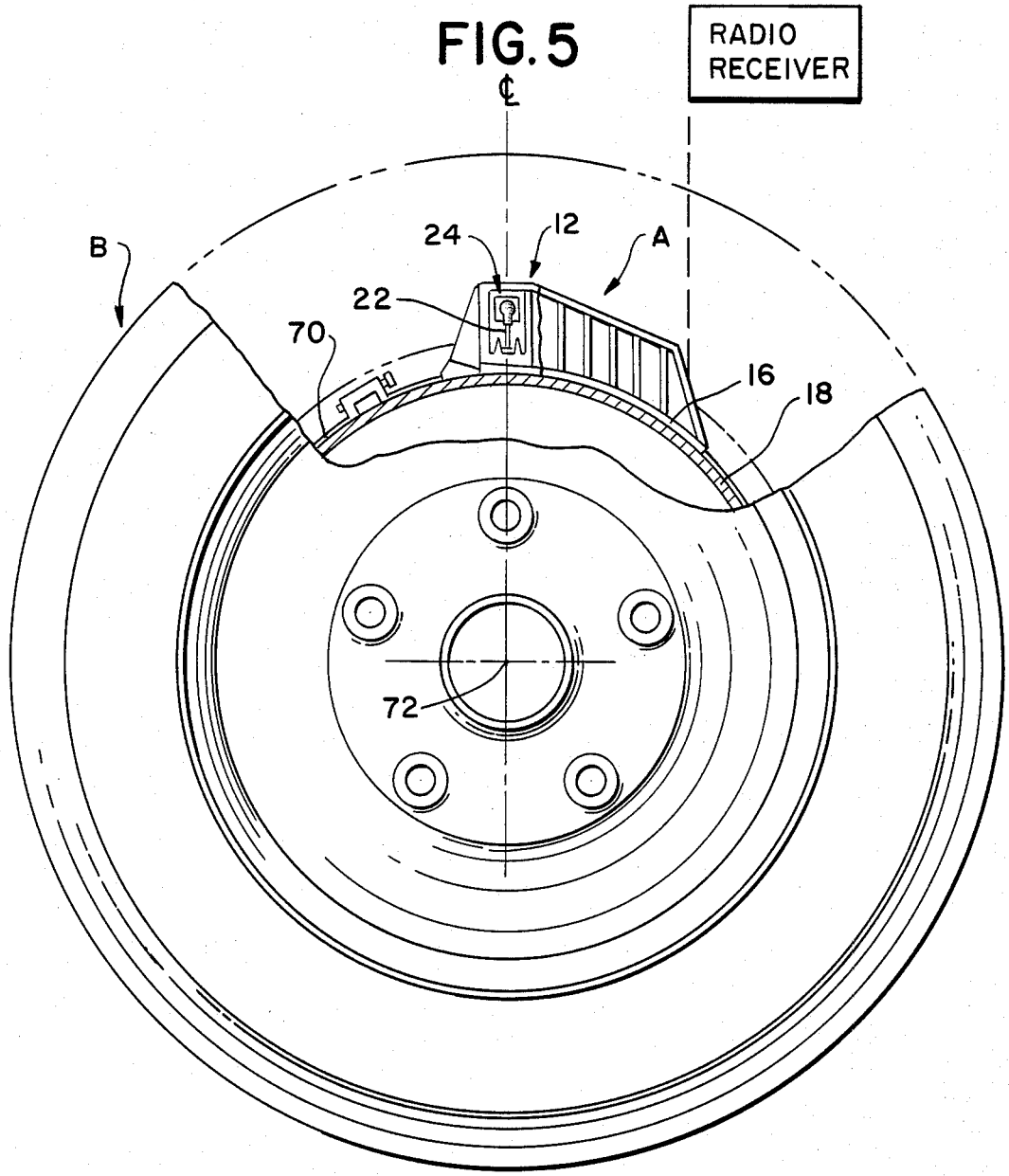
FIG. 5 is a partial cross-sectional view of a radio transmitter device in accordance with the present invention mounted on an automobile tire and particularly showing the alignment of the piezoelectric reed power supply along a radiating center line of the tire.

Referring now to the drawings which are for purposes of illustrating the preferred embodiment of the invention only and not for purposes of limiting the same, the FIGURES show a radio transmitter package A adapted for mounting on an automobile tire B including a radio circuit 10 and a piezoelectric reed power supply 12 for providing electrical energy to the circuit.

More specifically and with reference to FIG. 1, transmitter package A includes radio transmitter circuit 10 for use in a low tire warning system. A tire condition sensor 20 senses when the tire is in an abnormal condition and in association with logic circuitry included in radio circuit 10 initiates an identifying signal to an associated receiver 11 as diagramatically shown in FIG. 5. The radio circuit 10 and power supply 12 are contained in a housing 14 including a base wall 16 which is configured for close reception against the wheel rim 18 in the tire wheel cavity (FIG. 5).

With particular reference to FIGS. 2, 3 and 4, power supply 12 includes a radially extending piezoelectrically responsive transducer element 22 and a tuning mass member 24. Transducer element 22 comprises a piezoelectric crystal or reed having a one end or base portion 26 fixed against flexure movement by retention in an elastomeric retaining base 28. Hard shocks to a wheel including the subject invention could cause substantial damage to the element 22. The retaining base 28 insulates the crystal reed from the hard shocks but allows a second end portion 30 to flex in response to normal wheel vibrations. The retaining base further operates to insulate the element 22 against electrical shorts across the element during operation.

The tuning mass member 24 is mounted to the transducer second end portion 30 and facilitates the flexure movement of the transducer in associative response to the mechanical vibration imparted from a wheel.

Tuning mass member 24 comprises an inner elastomeric portion 38 and an outer weighted casing 40. The elastomer can be any of the many rubber-like materials conventionally available; similarly, casing 40 can be constructed of many heavy-weighted materials although lead has been preferably employed. The elastomeric portion 38 is in a dog bone configuration and is chemically bonded to the piezoelectric reed 22 with conventional mold bonding techniques. The outer weighted casing 40 is compression fitted to the elastomeric portion in a manner to insulate the reed from physical shocks to the outer casing during operation of the device. It is also important that the inner elastomeric portion electrically insulate the outer casing 40 from the transducer element 22 because outer casing 40 may be constructed of a material which may at times short the electrodes of the piezoelectric reed element 22. Compression fitting of the outer casing to the inner elastomeric portion provides improved operation as opposed to more conventional adhesive type means for attaching the casing to the inner portion. Although in the preferred embodiment the inner elastomer portion is of a dog bone type configuration, many alternate configurations could also be employed for successful compression fitting such as one including an enlarged central portion of the inner elastomer to be received in a mating slot in a tuning mass member.

It has been found that the power supply 12 may be tuned to be particularly susceptible to common wheel vibrations which occur during vehicle operation. A transducer resonant frequency can be changed by adjusting the size of the tuning mass member 24 or by adjusting the piezo reed 22 length to mass member 24 ratio. Preferably the power supply is tuned to have a resonant frequency of approximately 60 Hertz as this provides optimum electrical energy generation during wheel operation.

The piezoelectric transducer and tuning mass member are contained in a transducer chamber 36 (FIG. 1) which is sized for generally close containment of the tuning mass member to restrict the flexure movement of the reed.

With particular reference to FIG. 4, tuning mass member 24 includes a first side wall 44 and an opposed second side wall 46. Opposed first and second stop members 48, 50 are provided to limit the vibration stroke of the transducer element 22 to within safe flexure stress levels. The stop members comprise side walls of transducer chamber 36. The stop members 48, 50 are inclined for mating abutment against the tapered tuning mass member side walls 44, 46 to inhibit compound bending of the transducer element 22 during operation. Compound bending would occur if the tuning mass member 24 were to contact the stop member in a manner to induce a bend or stress in the transducer element 22 in addition to the normal bend or stress occurring in the transducer element from regular reed vibration. Preferably, tuning mass member 24 is tapered to mate against the inclined stop members as reed 22 is flexed during vibration to its permissible stroke limit. The combination of a power supply 12 including the features of limited vibration stroke and mating abutment of tuning mass member to stop member provides a power supply of extremely long life with limited tendencies towards operational failure due to cracking and breaking from flexure stress. The particular stop design of the present invention including the mating stop members eliminates the need for close tolerance parabolic or hyperbolic bending controls for operation of the power supply.

It is conventionally known that flexing of a piezoelectric material will induce a voltage across the material. For the subject transducer element 22 the voltage potential produced during vibration is communicated to radio circuit A by electrical conductors 52, 54 mounted for electrical contact to opposed sides of the transducer element 22. In addition to stop members 48, 50 additional restrictors for movement of the tuning mass member are included opposite of the top wall 58 of the mass member and opposite of additional side walls 60, 62 (FIG. 2) of the mass member to protect the piezoelectric reed generator from handling and road shocks.

Figure 6:
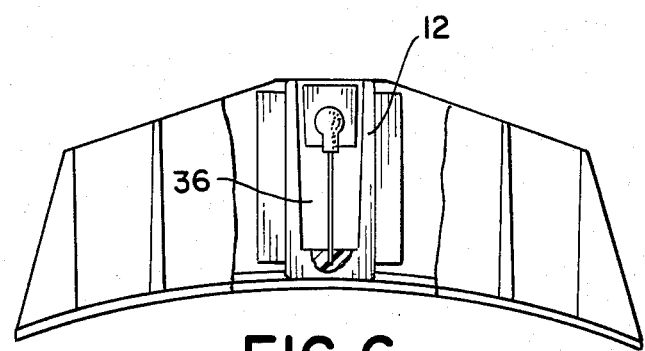
FIG. 6 is a cross-sectional view of another embodiment of the invention for use in an abnormal tire condition warning system including a piezoelectric reed power supply formed in accordance with the present invention.

With particular reference to FIG. 5, transmitter package A is mounted in a tire rim cavity against the tire rim 18 with an adjustable restraining band 70. Power supply 12 is positioned in housing 14 such that upon close alignment of housing base wall 16 to wheel rim 18 the piezoelectric reed element 22 is aligned with a radiating center line of the tire wheel B. During operation, centrifugal forces will operate to urge the tuning mass member 24 away from the radiating center 72 of the rotating wheel. Such forces will tend to align the plane defined by the piezoelectric reed element 22 with a radiating center line. In the event the reed element 22 is not aligned at a rest equilibrium state with a radiating center line, during operation centrifugal forces will cause the reed element to bend into such an alignment and may urge the tuning mass member 24 into continued engagement with an adjacent stop member. Such continued engagement would operate to reduce the vibration of the reed element and accordingly reduce the ability of the power supply 12 to power the radio circuit. It is an aspect of the invention that when the reed element 22 is properly aligned along a radiating center line, the power supply 12 may enjoy a maximum vibrational stroke during operation with optimum ability to power the radio circuit. To insure proper alignment along the radiating center line it may be necessary in certain applications to position reed element 22 in package center as shown in FIG. 6. In this regard, it is to be noted that in FIG. 6 the reed element is centrally positioned in a housing which has a symmetrical configuration. That is, the left hand portion of the housing is a mirror image of the right hand portion. This type of construction makes it easier to properly position the reed element along the radiating center line of the tire wheel.

The invention has been described with reference to the preferred embodiment. Obviously, modifications and alterations will occur to others upon the reading and understanding of the specification. It is my intention to include all such modifications and alterations insofar as they come within the scope of the appended claims or the equivalents thereof.

Having thus described my invention, I now claim:

1. A device for sensing a condition of a pneumatic tire preferably of the type used on a motor vehicle wherein the tire is mounted on a tire rim and the tire is subject to normal wheel vibrations, said device comprising:
  a housing;
  a means for mounting said housing to said tire rim;
  sensing means associated with said housing for monitoring a condition within the tire;
  circuit means associated with said housing including a radio transmitter circuit operatively connected to said sensing means for generating radio signals indicative of said tire condition;
  power supply means associated with said housing operatively connected to said circuit means, said power supply means including a piezoelectric reed having a base portion and an end portion, said base portion being fixedly attached to said housing, and a tuning mass member mounted to said end portion, said power supply further including opposed stop members spaced from said tuning mass member to permit flexure of said reed therebetween, said stop members and said tuning mass member being configured for mating abutment to inhibit compound bending of said reed during flexure; and
  means for receiving said radio signals.

2. The device as claimed in claim 1 wherein said housing is mounted in a cavity of said tire rim, said piezoelectric reed being aligned along a radiating center line of said tire rim.

3. The device as claimed in claim 1 wherein said stop members comprise wall portions of said housing, said stop members being spaced from said tuning mass member to limit flexure movement of said reed to an extent to inhibit flexing stress damage to said reed.

4. The device as claimed in claim 1 wherein said tuning mass member is sized relative to said reed to provide a natural resonant frequency of said power supply means of generally 60 Hertz.

5. The device as claimed in claim 1 wherein said tuning mass member includes an inner elastomeric insulating member and an outer weighted casing, said insulating member being chemically bonded to said reed and insulating said reed from physical shocks to said outer casing.

6. The device as claimed in claim 5 wherein said outer weighted casing is compression fitted to said inner elastomeric insulating member.

7. In a device for sensing the abnormal condition of a pneumatic tire of the type used on an automobile wherein the device includes a housing fastened to the tire rim, sensing means mounted to the housing for monitoring a condition within the tire, circuit means contained in the housing and operatively connected to said sensing means for transmitting a radio signal upon sensing of a predetermined condition by said sensing means, and means for receiving said signal and indicating the condition of said tire, the improvement comprising:
  a piezoelectric crystal power supply including a radially extending piezoelectric reed elastomerically mounted to said housing, said power supply further including a tuning mass member mounted to an end portion of said reed for facilitating vibration of said reed, said tuning mass member being sized relative to said reed to induce a resonant frequency vibration of said power supply, said resonant frequency being actuated upon normal operation of said automobile tire.

8. The improvement as described in claim 7 further including stop members limiting the vibration stroke of said reed and tuning mass member to within safe flexure stress levels of said reed.

9. The improvement as described in claim 8 wherein said stop members are configured for mating abutment to said tuning mass member to inhibit compound bending of said reed.

* * * * *